(12) United States Patent
Cho et al.

(10) Patent No.: US 9,320,147 B2
(45) Date of Patent: Apr. 19, 2016

(54) SEMICONDUCTOR MODULE ASSEMBLY

(71) Applicant: Samsung Electronics Co., Ltd., Suwon-si (KR)

(72) Inventors: Jeong-Hyeon Cho, Hwaseong-si (KR); Jae-Jun Lee, Seongnam-si (KR); Jung-Joon Lee, Seoul (KR); Baek Kyu Choi, Yongin-si (KR); Seung-Jin Seo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 510 days.

(21) Appl. No.: 13/754,906

(22) Filed: Jan. 31, 2013

(65) Prior Publication Data

US 2013/0194765 A1    Aug. 1, 2013

(30) Foreign Application Priority Data

Jan. 31, 2012 (KR) .................. 10-2012-0009440

(51) Int. Cl.
  *H05K 1/18* (2006.01)
  *H05K 1/14* (2006.01)

(52) U.S. Cl.
  CPC .............. *H05K 1/183* (2013.01); *H05K 1/14* (2013.01); *H05K 1/182* (2013.01); *H05K 1/141* (2013.01); *H05K 2201/10159* (2013.01); *H05K 2201/10325* (2013.01); *H05K 2201/2018* (2013.01); *H05K 2203/166* (2013.01)

(58) Field of Classification Search
  CPC .......... H05K 1/18; H05K 1/183; H05K 1/14; H05K 1/141

USPC .................. 361/785, 760, 783, 803; 174/260
  See application file for complete search history.

(56) References Cited

U.S. PATENT DOCUMENTS

| | | | |
|---|---|---|---|
| 5,221,209 A * | 6/1993 | D'Amico | .................. 439/71 |
| 5,434,750 A * | 7/1995 | Rostoker | ............ G03F 7/70433 |
| | | | 257/666 |
| 6,381,164 B1 | 4/2002 | Fan et al. | |
| 6,388,886 B1 | 5/2002 | Tobita | |
| 6,545,895 B1 | 4/2003 | Li et al. | |
| 6,597,062 B1 | 7/2003 | Li et al. | |
| 6,705,877 B1 | 3/2004 | Li et al. | |
| 6,772,261 B1 | 8/2004 | D'Antonio et al. | |
| 7,540,743 B2 | 6/2009 | Park et al. | |

(Continued)

FOREIGN PATENT DOCUMENTS

| | | |
|---|---|---|
| JP | 2001-0006825 | 1/2001 |
| KR | 2010-0008574 | 1/2010 |

*Primary Examiner* — Jenny L Wagner
*Assistant Examiner* — Michael P McFadden
(74) *Attorney, Agent, or Firm* — Muir Patent Law, PLLC

(57) ABSTRACT

A semiconductor module assembly is provided. The semiconductor module assembly includes a motherboard, a socket, and a semiconductor module. The motherboard includes an opening for receiving the semiconductor module, the opening including at least three sides. The socket is disposed in the opening along at least a first side, second side, and third side of the at least three sides. The semiconductor module is disposed in the socket. The semiconductor module includes at least one semiconductor device mounted on a module board. The socket includes at least a first side along the first side of the opening, and a second side along the second side of the opening, and the semiconductor module electrically connects to the motherboard through at least the first and second sides of the socket.

14 Claims, 8 Drawing Sheets

(56) References Cited

U.S. PATENT DOCUMENTS

| | | |
|---|---|---|
| 2006/0046573 A1 | 3/2006 | Hardell |
| 2006/0256603 A1 | 11/2006 | Foster, Sr. |
| 2006/0274562 A1 | 12/2006 | Coteus et al. |
| 2007/0015381 A1 | 1/2007 | Muff et al. |
| 2008/0001275 A1 | 1/2008 | Coteus et al. |
| 2008/0038961 A1 | 2/2008 | Park et al. |
| 2009/0072372 A1 | 3/2009 | Coteus et al. |
| 2009/0075502 A1 | 3/2009 | Coteus et al. |
| 2009/0209134 A1 | 8/2009 | Park et al. |
| 2009/0221155 A1 | 9/2009 | Hardell |
| 2011/0053388 A1 | 3/2011 | Zhu |
| 2011/0074457 A1* | 3/2011 | Roderick et al. ......... 324/756.02 |

* cited by examiner

SEMICONDUCTOR MODULE ASSEMBLY

CROSS-RELATED APPLICATION

This application claims priority under 35 USC §119 to Korean Patent Application No. 10-2012-0009440, filed on Jan. 31, 2012 in the Korean Intellectual Property Office (KIPO), the contents of which are herein incorporated by reference in their entirety.

BACKGROUND

Example embodiments relate to a semiconductor module assembly. More particularly, example embodiments relate to a memory module assembly mounted on a motherboard via a socket.

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

A memory module including a plurality of the semiconductor packages may be mounted on a motherboard of a terminal unit such as a personal computer, a notebook, a tablet computer, a cellular phone, etc., via a socket.

In order to meet needs of customers that may want a light notebook, studies for reducing a thickness of the notebook have been performed. The thickness of the notebook may depend upon heights of parts mounted on the motherboard. Thus, a height from the motherboard to the memory module may act as an important factor for determining the thickness of the notebook.

According to certain systems, a memory module may be installed at a socket mounted on a motherboard. A height from the motherboard to the memory module may include a thickness of the socket. As a result, there may exist a limit for decreasing the thickness of the notebook or other personal computing device.

SUMMARY

Example embodiments provide a module assembly having a reduced thickness.

In one embodiment, a semiconductor module assembly is disclosed. The semiconductor module assembly includes a motherboard, a socket, and a semiconductor module. The motherboard includes an opening for receiving the semiconductor module, the opening including at least three sides. The socket is disposed in the opening along at least a first side, second side, and third side of the at least three sides. The semiconductor module is disposed in the socket. The semiconductor module includes at least one semiconductor device mounted on a module board. The socket includes at least a first side along the first side of the opening, and a second side along the second side of the opening, and the semiconductor module electrically connects to the motherboard through at least the first and second sides of the socket.

A first portion of the socket may be disposed above the motherboard and overlap a portion of the motherboard, wherein no portion of the socket is disposed below the motherboard where the socket overlaps the motherboard. A second portion of the socket may be disposed below the module board and overlaps a portion of the module board, wherein no portion of the socket is disposed above the module board where the socket overlaps the module board.

In one embodiment, a socket for a motherboard may include at least three sides configured to be disposed along at least three sides of an opening in a motherboard. At least two of the sides may include conductive lines configured to electrically connect a motherboard to a semiconductor module, and each of the sides of the socket may include a fixing portion configured to attach to a motherboard, and a supporting portion configured to support a semiconductor module.

BRIEF DESCRIPTION OF THE DRAWINGS

Example embodiments will be more clearly understood from the following detailed description taken in conjunction with the accompanying drawings.

FIG. 1 is a plan view illustrating a module assembly in accordance with example embodiments;

FIG. 2 is an exemplary cross-sectional view taken along a line II-II' in FIG. 1;

FIG. 3 is a plan view illustrating an exemplary motherboard of the module assembly in FIG. 1;

FIG. 4 is a plan view illustrating an exemplary socket of the module assembly in FIG. 1;

FIG. 5 is a plan view illustrating an exemplary module of the module assembly in FIG. 1;

FIG. 6 is an exemplary enlarged cross-sectional view of a portion VI in FIG. 2;

FIG. 7 is a cross-sectional view illustrating an exemplary module assembly in accordance with example embodiments;

FIG. 8 is an exemplary close-up cross-sectional view of the example shown in FIG. 7;

FIG. 9 is a plan view illustrating an exemplary module assembly in accordance with example embodiments;

FIG. 10 is a plan view illustrating an exemplary motherboard of the module assembly in FIG. 9;

FIG. 11 is a plan view illustrating an exemplary socket of the module assembly in FIG. 9;

FIG. 12 is a plan view illustrating an exemplary module of the module assembly in FIG. 9;

FIG. 13 is a plan view illustrating an exemplary module assembly in accordance with example embodiments;

FIG. 14 is an exemplary cross-sectional view taken along a line XIV-XIV' in FIG. 13;

FIG. 15 is a plan view illustrating an exemplary module assembly in accordance with example embodiments; and FIG. 16 is an exemplary cross-sectional view taken along a line XVI-XVI' in FIG. 15.

DETAILED DESCRIPTION OF THE EMBODIMENTS

Figure 1:
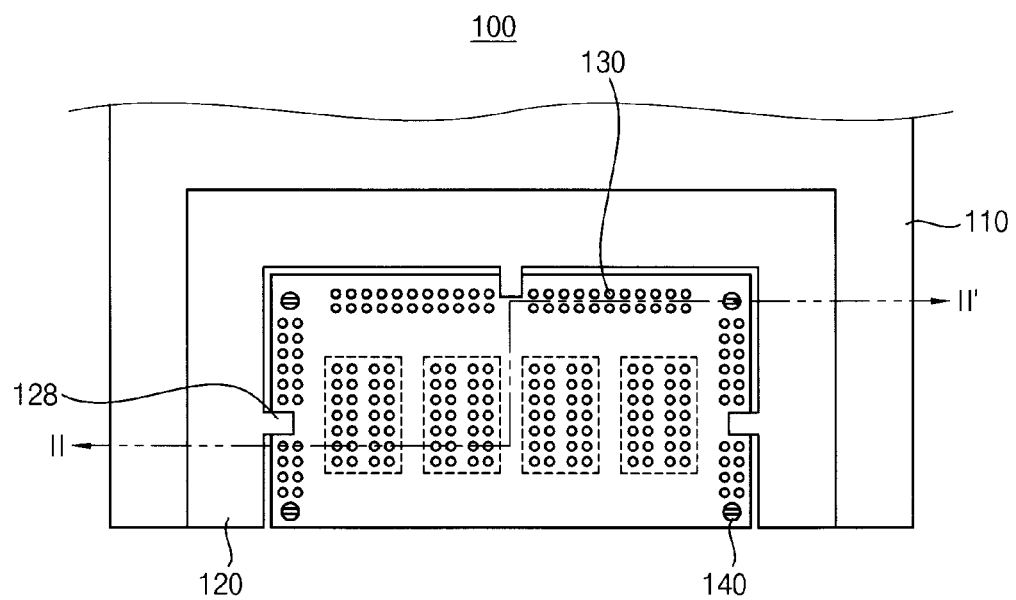
FIGS. 1 to 16 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a corner region depicted as having a right angle may have a sharp angle, as depicted in certain figures, or may have slightly rounded corners due to standard variations due to manufacturing processes. Thus, the regions illustrated in the figures are schematic in nature and their shapes are not intended to limit the scope of the present invention.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure relates. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
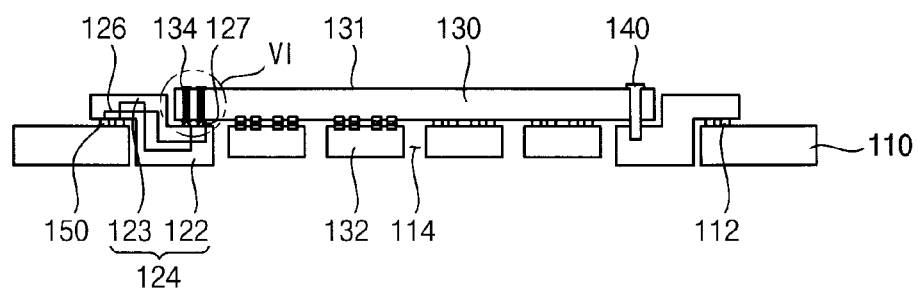
Figure 3:
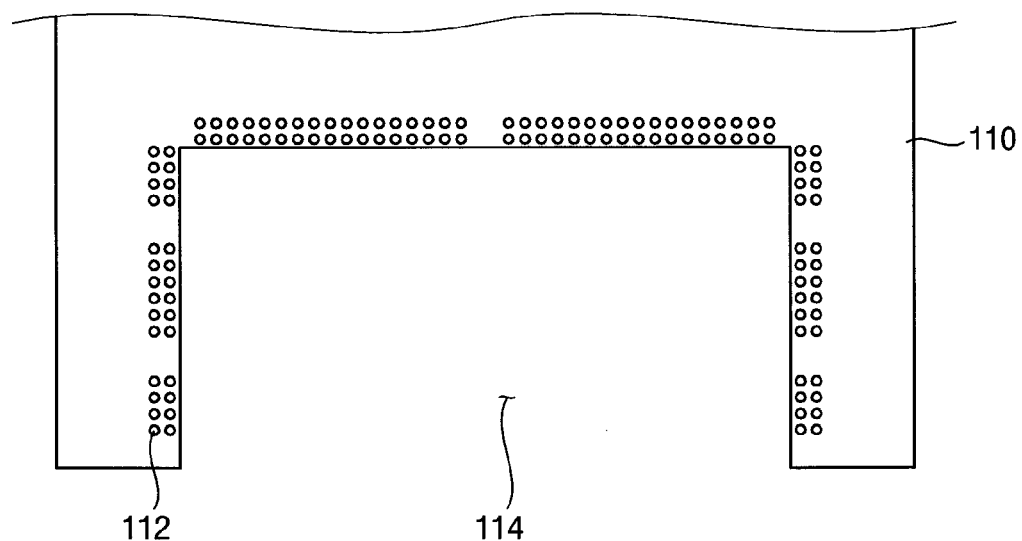
Figure 4:
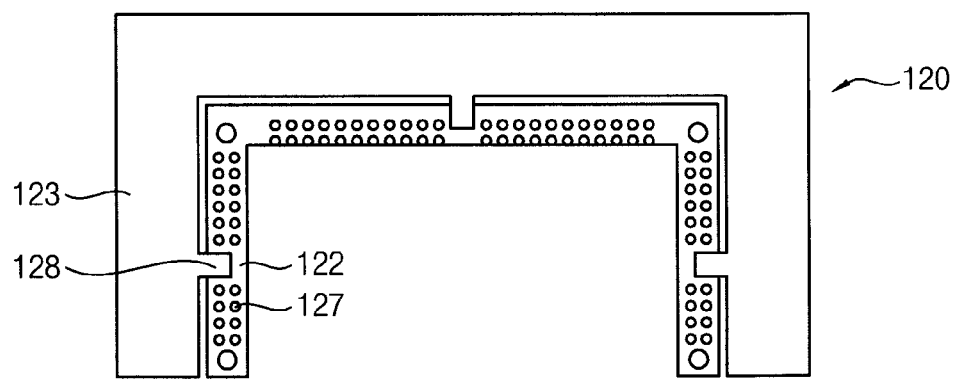
Figure 5:
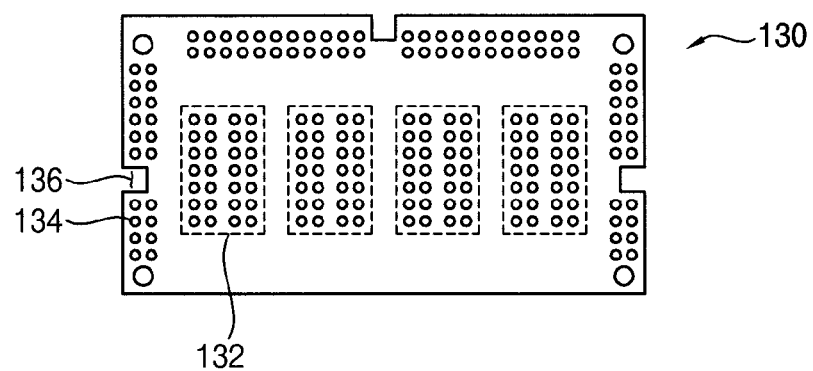
Figure 6:
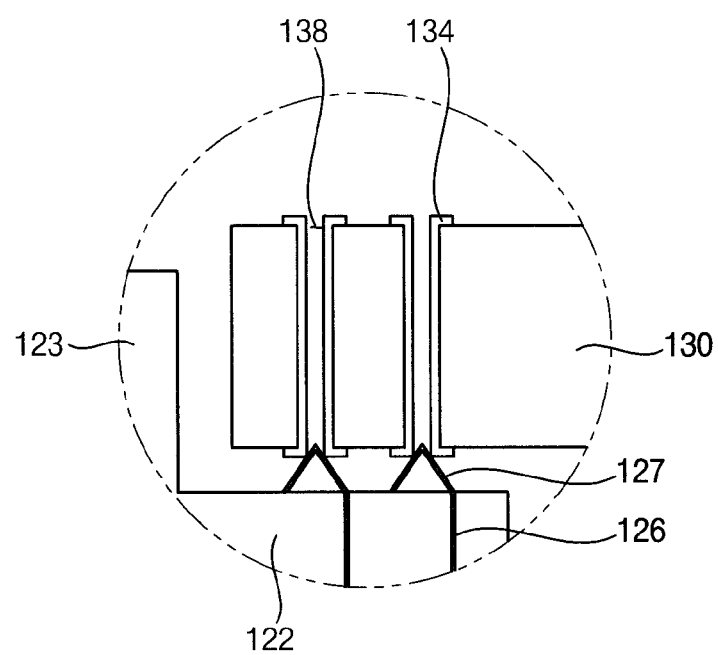

FIG. 1 is a plan view illustrating a module assembly in accordance with example embodiments, FIG. 2 is an exemplary cross-sectional view taken along a line II-II' in FIG. 1, FIG. 3 is a plan view illustrating an exemplary motherboard of the module assembly in FIG. 1, FIG. 4 is a plan view illustrating an exemplary socket of the module assembly in FIG. 1, FIG. 5 is a plan view illustrating an exemplary memory module of the module assembly in FIG. 1, and FIG. 6 is an exemplary enlarged cross-sectional view of a portion VI in FIG. 2. The module assembly described herein is particularly described as a memory module assembly. A memory module assembly may include a memory module such as, for example, a dual in-line memory module (DIMM) or single in-line memory module (SIMM). However, the type of module need not be a memory module, and may be, for example, a module including one or more other types of semiconductor devices, such as microprocessor devices. A module including one or more semiconductor devices mounted thereon is referred to herein as a semiconductor module.

Referring to FIGS. 1 and 2, a memory module assembly 100 of this example embodiment may include a motherboard 110, a socket 120 and a memory module 130. In example embodiments, the motherboard 110 may be provided to a terminal unit such as a notebook, tablet computer, or other personal computing device. The socket 120 may be fixed to the motherboard 110. The memory module 130 may be mounted to the socket 120. The memory module 130 may be electrically connected with the motherboard 110 via the socket 120.

Referring to FIG. 3, the motherboard 110, also referred to herein as a main board, or first board, may be, for example, a printed circuit board (PCB). The motherboard 110 may have an opening, also referred to herein as a receiving groove 114. In example embodiments, the receiving groove 114 may have a rectangular shape formed at a side surface of the motherboard 110. Thus, in one embodiment, the receiving groove 114 may have three sides (e.g., a first side, second side, and third side). Board pads 112, which may serve as electrical connections configured to pass electrical signals between the motherboard 110 and objects mounted on the motherboard 110, may be arranged on an upper surface of the motherboard 110 along the three sides. The board pads 112 may be formed of conductive material connected to internal circuitry in the motherboard 110. The receiving groove 114 may be vertically formed through the entire motherboard 110. For example, the receiving groove 114 may have a thickness the same as that of the motherboard 110. As such, a portion of the motherboard may have an opening that forms the receiving groove 114. In one embodiment, at the opening, the motherboard is completely absent. Alternatively, the receiving groove 114 may be formed only on a surface of the motherboard 110 (e.g., the upper surface). The remainder of the material of the motherboard 110 may remain below the opening. In this case, the receiving groove 114 may have a depth less than the thickness of the motherboard 110.

Referring to FIGS. 1, 2 and 4, the socket 120 may be disposed in the receiving groove 114. For example, the socket 120 may be a connector configured to connect a motherboard to a memory module. The socket 120 may include a plurality of sides (e.g., two or more sides). In one embodiment, the socket 120 includes sides that correspond to the number of sides in the receiving groove 114. For example, in the embodiment shown in FIGS. 1, 2, and 4, the socket 120 includes three sides. As described further below, the socket 120 may be configured to electrically connect the motherboard to a memory module. For example, in one embodiment, the socket 120 includes electrical connections on two or more sides, each electrical connection configured to electrically connect circuitry in the motherboard 110 to circuitry in the memory module 130.

In one embodiment, the socket 120 may be fixed to the upper surface of the motherboard 110. A bottom surface of a first portion of the socket 120 may face a top surface of the motherboard 110. The bottom surface of the first portion of the socket 120 may attach to the top surface of the motherboard. In example embodiments, because the socket 120 may be located in the receiving groove 114 and may have a first, outer portion disposed only above the motherboard 110 and a second, inner portion disposed only below a module board of a memory module 130, such as depicted in FIG. 2, a thickness of the socket 120 from an uppermost surface to a lowermost surface of the socket 120 may have no influence on a height from a bottom of the motherboard 110 to a top of the memory module 130. Particularly, in one embodiment, the thickness of the socket 120 may be no more than a total thickness by adding the thickness of the motherboard 110 to the thickness of a module board of the memory module 130. Thus, the height from a first surface of the motherboard 110 to an opposite surface of the memory module 130 may not be increased due to the thickness of the socket 120.

In example embodiments, the socket 120 may include a socket body 124 and a conductive line 126. The socket body 124 may include first and second portions, such as a supporting portion 122 and a fixing portion 123.

The supporting portion 122 may be positioned in the receiving groove 114. The memory module 130 may be mounted on an upper surface of the supporting portion 122. In example embodiments, the supporting portion 122 may have a lower surface that is coplanar with a lower surface of the motherboard 110. Alternatively, the supporting portion 122 may have a lower surface not coplanar with the motherboard 110 (e.g., the lower surface may be higher than that of the motherboard 110).

The fixing portion 123 may be extended from the upper surface of the supporting portion 122 to the upper surface of the motherboard 110. The fixing portion 123 may be fixed to the upper surface of the motherboard 110. A bottom surface of the fixing portion 123 may face and be mounted on a top surface of the motherboard 110. The fixing portion 123 may have an upper surface lower than the upper surface of a module board of the memory module mounted on the upper surface of the supporting portion 122. Alternatively, the fixing portion 123 may have an upper surface that is coplanar with that of the memory module 130. Therefore, the height from one surface of the motherboard 110 to an opposite surface of the memory module 130 may not be increased due to the thickness of the socket 120 corresponding to a length between the lower, bottommost surface of the supporting portion 122 and the upper, topmost surface of the fixing portion 123.

In one embodiment, the top surface of the supporting portion 122 is lower than a top surface of the motherboard 110. Also, the bottom surface of the fixing portion 123 may be higher than a bottom surface of a module board of memory module 130. In another embodiment, the top surface of the supporting portion 122 is higher than a top surface of the motherboard 110. Also, the bottom surface of the fixing portion 123 may be lower than a bottom surface of a module board of memory module 130.

In example embodiments, the fixing portion 123 may have an aligning key 128. The aligning key 128 may be inserted into one or more aligning grooves 136 of the memory module 130 that align with the aligning key 128 to accurately mount the memory module 130 on the upper surface of the supporting portion 122. Because the receiving groove 114 may have a plurality of sides (e.g., three sides), the aligning key 128 may include a plurality of teeth located at a plurality of sides of the socket 120. For example, an aligning key 128 may include three teeth, each formed on one side of the socket 120. In one embodiment, the teeth are formed at central portions of three inner side surfaces of the socket 120, respectively.

The conductive line 126 may be built in the socket body 124. The conductive line 126 may be formed of a conductive material, such as a metal. In example embodiments, the conductive line 126 may be formed in the supporting portion 122 and the fixing portion 123. The conductive line 126 may have a first end exposed through the lower surface of the fixing portion 123, and a second end exposed through the upper surface of the supporting portion 122. A socket pad (not shown) may be formed on the first end of the conductive line 126. The socket pad may be electrically connected with the board pad 112 of the motherboard 110 via a solder 150.

In example embodiments, a contact portion 127 may be formed on the second end of the conductive line 126. The contact portion 127 may be exposed at a top surface of the supporting portion 122 of the socket 110. The contact portion 127 may resiliently make contact with a module pad 134 of the memory module 130 to electrically connect the module pad 134 with the conductive line 126. In one embodiment, the contact portion 127 may have a wedge shape.

Referring to FIGS. 1, 2, 5 and 6, the memory module 130 may include a module board 131, one or more semiconductor devices 132, the module pad 134 and the aligning groove 136. The module board may be a PCB or other substrate for mounting semiconductor devices thereon. Each semiconductor device 132 may be, for example, a semiconductor package including one or more semiconductor chips stacked on a package substrate. The package can be a package-on-package device. Each device may also be a single chip or a stack of chips and may not include a package substrate. The semiconductor devices may be memory devices. For example, the memory module 130 may be a SIMM or DIMM including a plurality of memory devices 132 mounted on a module board 131. Alternatively, the semiconductor devices may be logic devices, such as, for example, microprocessor chips.

The memory module 130 may be mounted on the upper surface of the supporting portion 122 of the socket 120. For example, a portion of a lower surface of the module board 131 may face and overlap with the upper surface of the supporting portion 122 of the socket 120. At a region where the module board 131 faces and overlaps with the supporting portion 122 of the socket 120, the module board 131 may electrically connect with the socket 120, as described further below.

In example embodiments, the memory module 130 may be fixedly secured to the socket 120 using screws 140. The screws 140 may be arranged at four corners of the memory module 130. The screws 140 may pass through the module board 131 and at least a portion of the socket 120. Thus, the memory module 130 may be readily assembled/disassembled with/from the socket 120 by rotating the screws 140, so that the memory module 130 may be easily reworked.

In example embodiments, the one or more semiconductor devices 132 may be arranged on the lower surface of the memory module 130. For example, the one or more semiconductor devices 132 may be attached to a surface of the module board 131 that faces the opening in the motherboard 110. Thus, the one or more semiconductor devices 132 may be oriented toward the receiving groove 114 of the motherboard 110. As a result, the height from the motherboard 110 to the memory module 130 may not include a thickness of the one or more semiconductor devices 132.

As shown in the description above, in certain embodiments, the one or more semiconductor devices 132 are disposed in the opening, and at least part of at least one of the one or more semiconductor devices 132 is coplanar with at least part of the motherboard. In an embodiment where, for example, a DIMM is used, additional semiconductor devices may be disposed on the other side of the module board 131.

As also shown in the description above, in certain embodiments, a first portion of the socket 120 is disposed above the motherboard 110 and overlaps a portion of the motherboard 110, while no portion of the socket 120 is disposed below the motherboard 110 where the socket overlaps the motherboard 110. Also, in certain embodiments, a second portion of the socket 120 is disposed below the module board 131 and overlaps a portion of the module board 131, while no portion of the socket 120 is disposed above the module board 131 where the socket 120 overlaps the module board 131.

In example embodiments, module pads 134 may be arranged on three edge portions of the memory module 130. Module pads 134 may be formed of a conductive material, such as, for example, one or more metals. The module pad 134 may be formed, for example, in a via hole 138 formed through the edge portions of the module board 131 of the memory module 130. The module pad 134 may be formed on an inner surface of the via hole 138. Thus, the via hole 138 may not be fully filled with the module pad 134. When the memory module 130 is mounted on the upper surface of the supporting portion 122, the lower surface of the module board 131 of the memory module 130 may press the contact portion 127. Simultaneously, an upper end of the wedge-shaped contact portion 127 may be inserted into the via hole 138. A part of the contact portion 127 may therefore be disposed in the via hole 138. The upper end of the contact portion 127 may resiliently make contact with a lower end of the module pad 134. Thus, an electrical connection between the module pad 134 and the conductive line 126 may be ensured by the contact portion 127.

Figure 7:
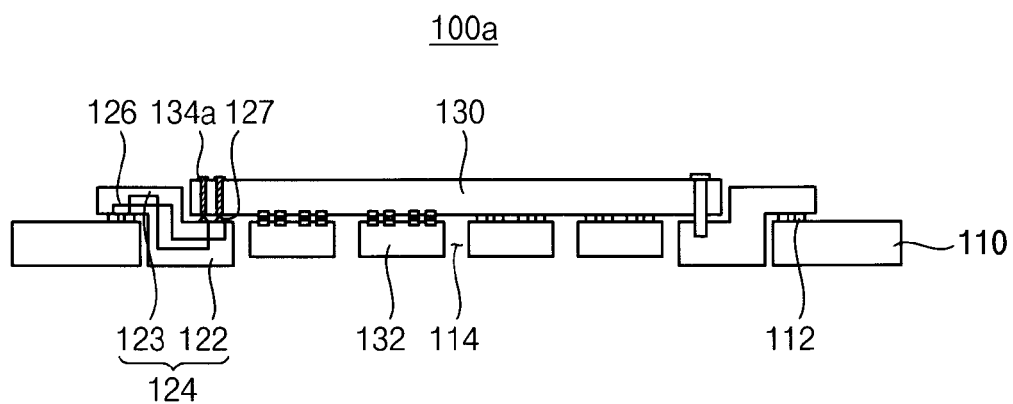
Figure 8:
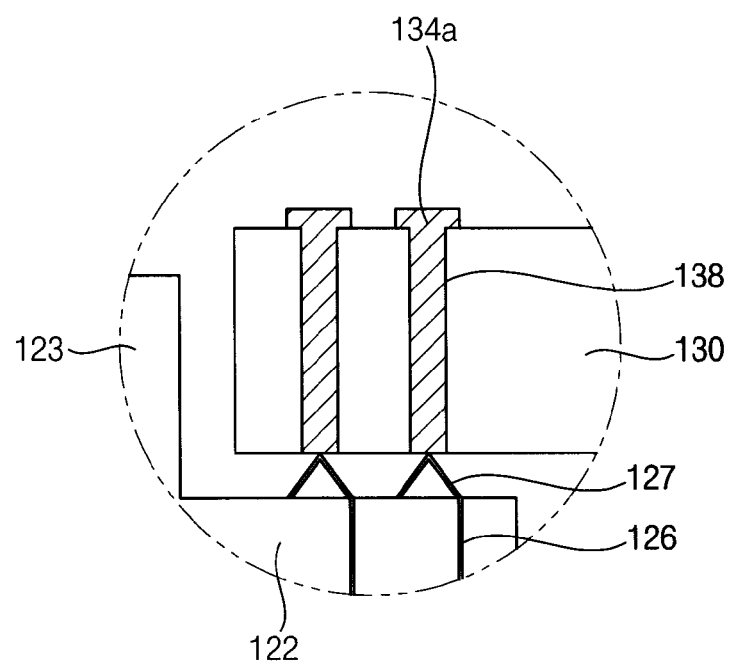

FIG. 7 is a cross-sectional view illustrating an exemplary memory module assembly in accordance with example embodiments, and FIG. 8 is an exemplary close-up cross-sectional view of the example shown in FIG. 7.

A memory module assembly 100a of this example embodiment may include elements substantially the same as those of the memory module assembly 100 in FIG. 1 except for a module pad of a memory module. Thus, the same reference numerals may refer to the same elements and any further illustrations with respect to the same element may be omitted herein for brevity.

Referring to FIGS. 7 and 8, the memory module 130 of the memory module assembly 100a may include a module pad 134a. In example embodiments, the via hole 138 may be fully filled with the material that forms module pad 134a. Thus, the upper end of the contact portion 127 in the socket 120 may resiliently make contact with the lower surface of the module pad 134a.

Alternatively, because the upper end of the contact portion 127 cannot be inserted into the via hole 138 since the via hole 138 is completely filled with the module pad 134a in the embodiment of FIG. 8, the contact portion 127 may have a flat upper surface. The flat upper surface may be oriented parallel to the bottom surface of the module pad 134a. The flat upper surface may contact the bottom surface of the module pad 134a. Further, the contact portion 127 may include an inelastic material.

Figure 9:
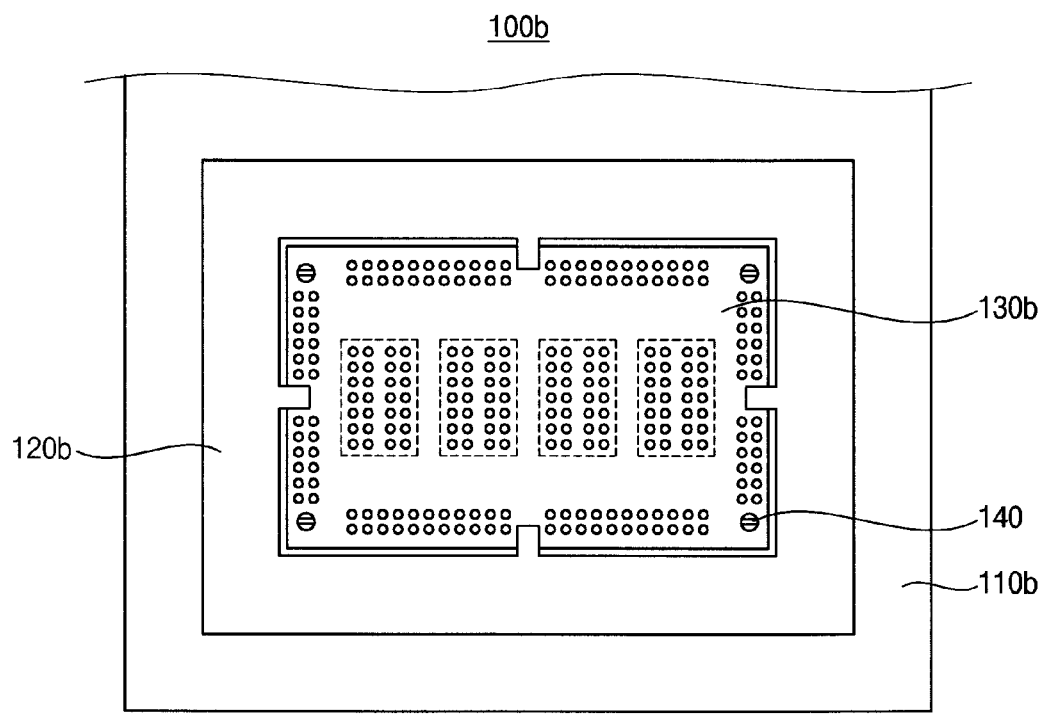
Figure 10:
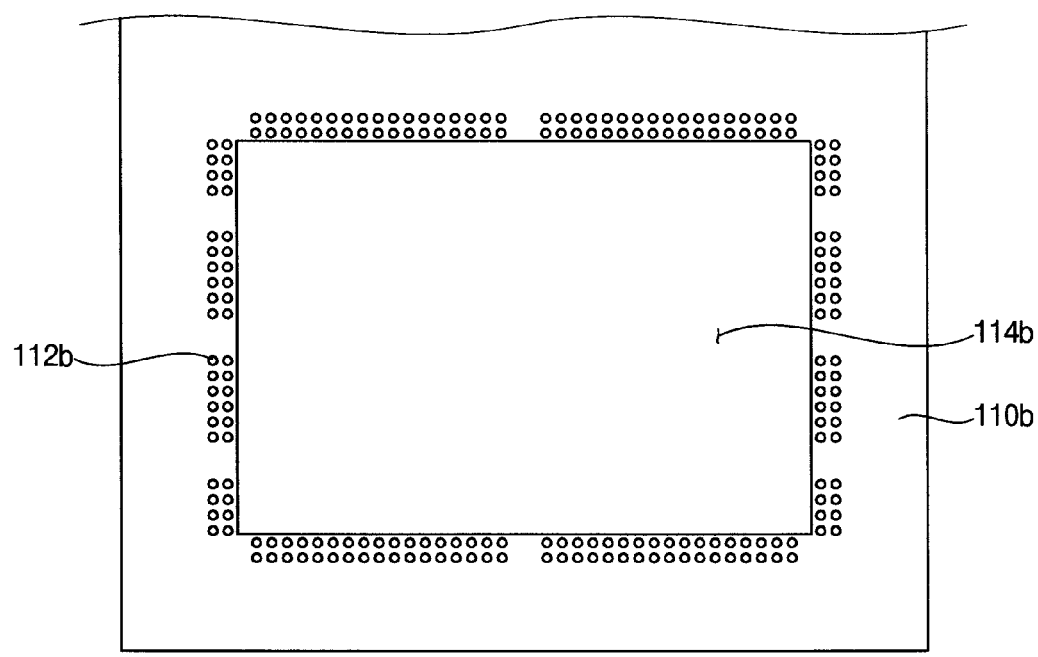
Figure 11:
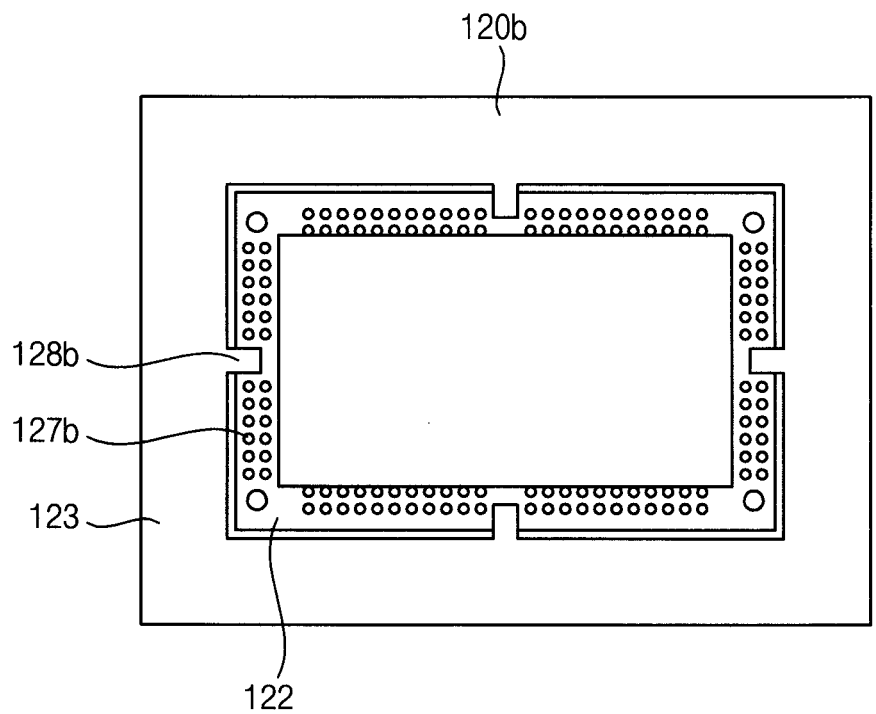
Figure 12:
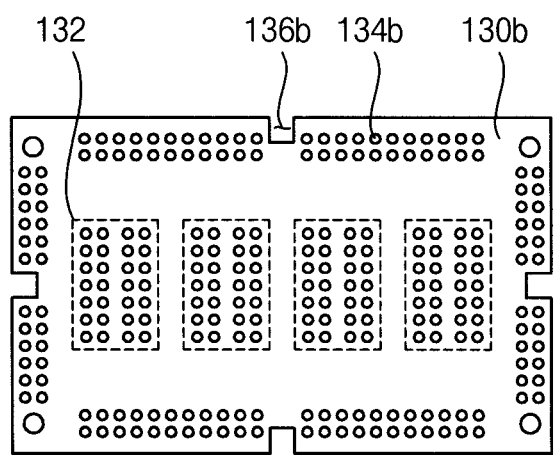

FIG. 9 is a plan view illustrating a memory module assembly in accordance with example embodiments, FIG. 10 is a plan view illustrating an exemplary motherboard of the memory module assembly in FIG. 9, FIG. 11 is a plan view illustrating an exemplary socket of the memory module assembly in FIG. 9, and FIG. 12 is a plan view illustrating an exemplary memory module of the memory module assembly in FIG. 9.

Referring to FIGS. 9 to 12, a memory module assembly 100b of this example embodiment may include a motherboard 110b, a socket 120b and a memory module 130b.

The motherboard 110 may have a receiving groove 114b. In example embodiments, the receiving groove 114b may have a rectangular shape formed at a central portion of the motherboard 110b. Thus, the receiving groove 114b may have four sides. Board pads 112b may be formed on an upper surface of the motherboard 110b along the four sides.

In example embodiments, the socket 120b may have a rectangular frame shape corresponding to the shape of the receiving groove 114b. Contact portions 127b may be arranged on an upper surface of the socket 120b. Further, the socket 120b may have an aligning key 128b on four sides of the socket 120b. The aligning key 128b may include, for example, four aligning teeth formed at four inner surfaces of the socket 120b.

In example embodiments, a supporting portion 122 and a fixing portion 123 of the socket 120b may have shapes substantially the same as those of the supporting portion 122 and the fixing portion 123 of the socket 120 in FIG. 1, respectively. Thus, any further illustrations with respect to the supporting portion 122 and the fixing portion of the socket 120b may be omitted herein for brevity.

In example embodiments, the memory module 130b may include a module pad 134 and one or more aligning grooves 136b. The module pad 134b may be arranged in four edge portions along four sides of the memory module 130b. The one or more aligning grooves 136b may be formed at the four sides of the memory module 130b.

Figure 13:
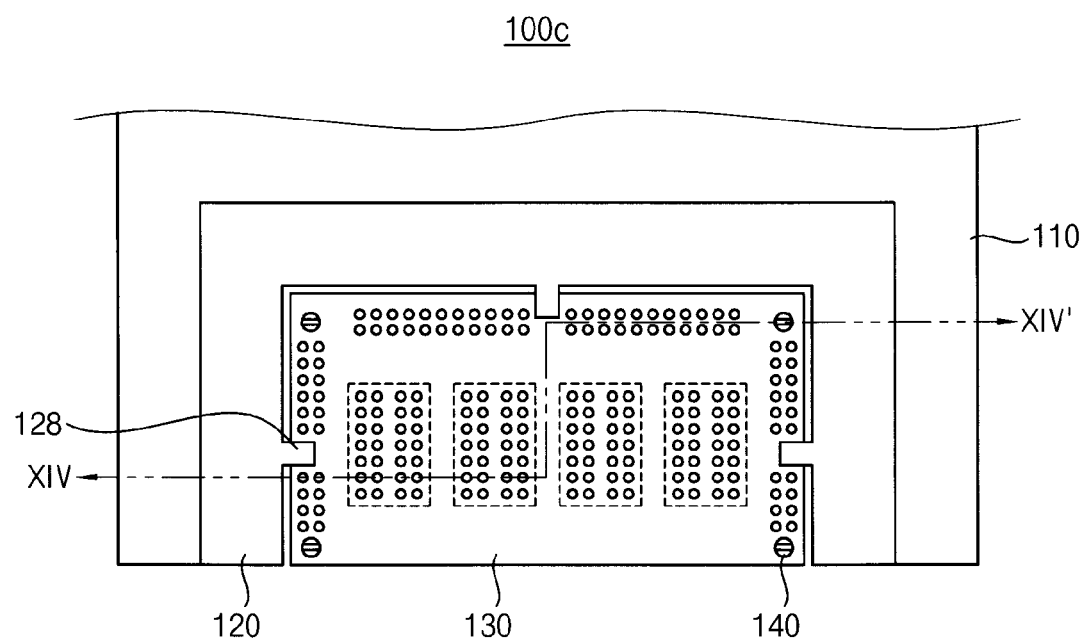
Figure 14:
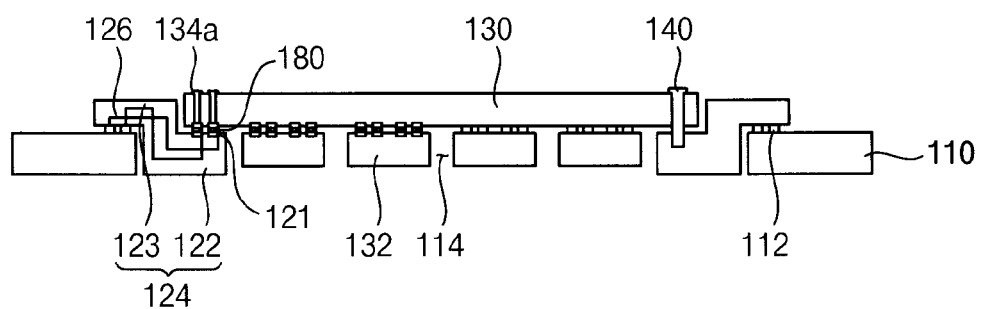

FIG. 13 is a plan view illustrating a memory module assembly in accordance with example embodiments, and FIG. 14 is an exemplary cross-sectional view taken along a line XIV-XIV' in FIG. 13.

A memory module assembly 100c of this example embodiment may include elements substantially the same as those of the memory module assembly 100 in FIG. 1 except for a fixing manner between the memory module and the socket. Thus, the same reference numerals may refer to the same elements and any further illustrations with respect to the same element may be omitted herein for brevity.

Referring to FIGS. 13 and 14, the memory module 130 may be fixed to the socket 120 by a solder 180. The solder may be, for example a ball or bump formed of a conductive soldering material. The socket 120 may not have a contact portion such as described above at an end of the conductive line 126. Instead, the second end of the conductive line 126 in the socket 120 may connect to the lower end of the module pad 134 in the memory module 130 by the solder 180. The second end of the conductive line 126 may terminate at a socket pad 121 that electrically and physically connects to the module pad 134 through the solder 180. One or more screws 140 may be included to fixedly attach the memory module 130 to the socket 120. However, because a solder 180 is used between the memory module 130 and the socket 120, the solder 180 may both electrically connect and physically fixedly attach the memory module 130 to the socket 120. As such, the screws 140 may be omitted.

In order to repair the memory module 130, a heat may be applied to the upper end of the module pad 134. The heat may then be transferred to the solder 180, so that a bonding strength of the solder 180 may be weakened. Therefore, the module pad 134 may be readily detached from the conductive line 126.

Figure 15:
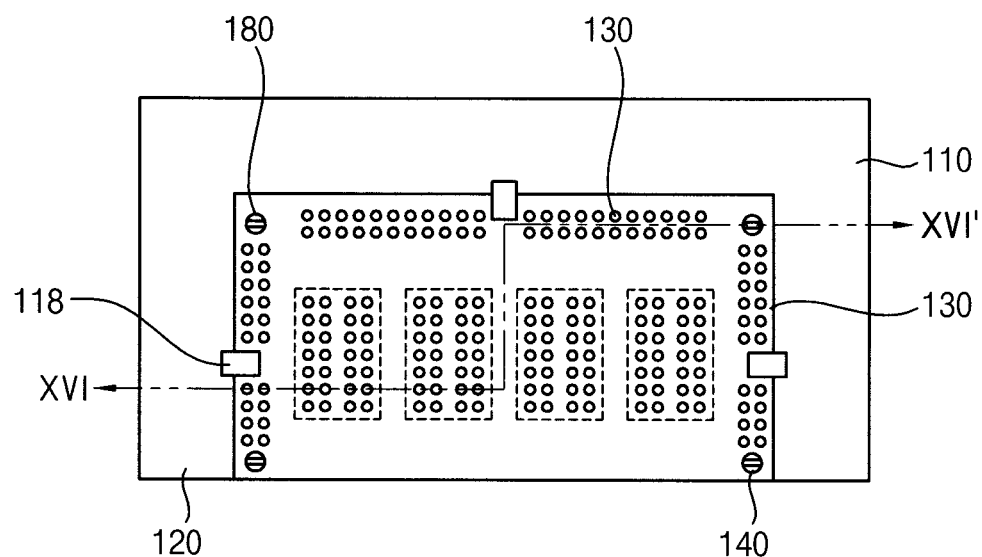
Figure 16:
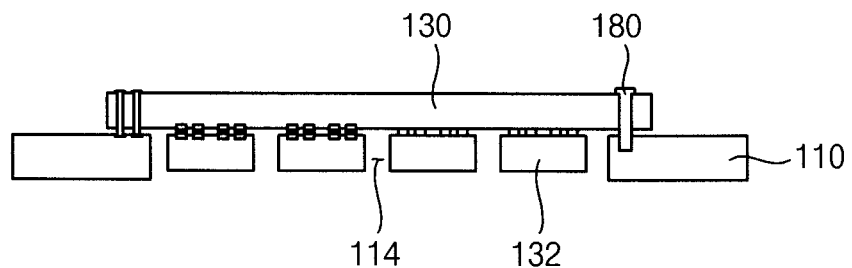

FIG. 15 is a plan view illustrating a memory module assembly in accordance with example embodiments, and FIG. 16 is an exemplary cross-sectional view taken along a line XVI-XVI' in FIG. 15.

Referring to FIGS. 15 to 16, a memory module assembly 100d of this example embodiment may include a motherboard 110 and a memory module 130. The memory module assembly 100d may not include the socket 120 in FIG. 1. The memory module 130 may be directly fixed to the motherboard 110 by a screw 180.

Further, because the memory module assembly 100d may not include the socket, an aligning key 118, which may be inserted into the aligning groove 136 of the memory module 130, may be formed at the motherboard 110.

In example embodiments, the motherboard 110 and the memory module 130 may have shapes substantially the same as those of the motherboard 110 and the memory module 130 in FIG. 1, respectively. Thus, any further illustrations with respect to the motherboard 110 and the memory module 130 may be omitted herein for brevity.

According to some example embodiments, the socket may be received in the receiving groove of the motherboard, so that a height from one surface of the motherboard to an opposite surface of a semiconductor module may not include a thickness of the socket. Further, one or more semiconductor packages of the semiconductor module may be oriented toward the receiving groove, so that the height from one surface of the motherboard to an opposite surface of the semiconductor module (e.g., a surface of a module board of the semiconductor module opposite the surface of the motherboard) may also not include a thickness of the semiconductor package. Therefore, the combined height of the motherboard to the memory module may be reduced. For example, in one embodiment, the thickness of the semiconductor module assembly is no greater than a combined thickness of the motherboard and module board. A terminal unit such as a notebook, a cellular phone, etc., that uses the semiconductor module assembly disclosed herein may have a very thin thickness.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures.

What is claimed is:

1. A semiconductor module assembly comprising:
a motherboard including an opening the opening including at least three sides; a socket disposed in the opening along at least a first side, a second side, and a third side of the at least three sides of the opening; and a semiconductor module disposed in the socket, the semiconductor module including at least one semiconductor device mounted on a module board, wherein: the socket includes at least a first socket side along the first side of the opening, and a second socket side along the second side of the opening, wherein each of the first socket side and the second socket side includes conductive lines, and the semiconductor module electrically connects to the motherboard through at least the conductive lines of the first socket side and the conductive lines of the second socket side, wherein the first socket side is perpendicular to the second socket side; wherein: the at least one semiconductor device is disposed in the opening, and at least part of the at least one semiconductor device is coplanar with at least part of the motherboard, wherein: a first portion of the socket is disposed above the motherboard and overlaps a portion of the motherboard; no portion of the socket is disposed below the motherboard where the socket overlaps the motherboard; a second portion of the socket is disposed below the module board and overlaps a portion of the module board; and no portion of the socket is disposed above the module board where the socket overlaps the module board.

2. The semiconductor module assembly of claim 1, wherein:
the socket includes at least a third socket side along the third side of the opening; and
the semiconductor module also electrically connects to the motherboard through the third socket side of the socket.

3. The semiconductor module assembly of claim 1, wherein:
a bottom surface of a first portion of the socket faces a top surface of the motherboard; and
a top surface of a second portion of the socket faces a bottom surface of the module board.

4. The semiconductor module assembly of claim 1, wherein:
a thickness of the semiconductor module assembly is no greater than a combined thickness of the motherboard and the module board.

5. The semiconductor module assembly of claim 1, wherein:
the socket includes an aligning key that aligns with aligning grooves on the module board.

6. The semiconductor module assembly of claim 5, wherein:
the aligning key includes teeth portions on the first socket side, the second socket side, and the third socket side of the socket.

7. The semiconductor module assembly of claim 1, wherein:
the module board includes a via hole including a conductive material disposed therein and exposed to the outside of the module board;
the socket includes a conductive line including a contact portion exposed at a top surface of a second portion of the socket; and
the conductive material contacts the contact portion of the conductive line.

8. The semiconductor module assembly of claim 1, wherein:
the semiconductor module assembly is a memory module assembly;
the semiconductor module is a memory module;
the at least one semiconductor device includes a plurality of semiconductor memory packages; and the plurality of semiconductor memory packages are in electrical communication with the motherboard through the socket and the module board.

9. A semiconductor module assembly comprising:
a motherboard including an opening for receiving a semiconductor module, the opening including at least three sides; a socket disposed in the opening along at least a first side, a second side, and a third side of the at least three sides, the socket having a first socket side corresponding to the first side of the opening, a second socket side corresponding to the second side of the opening, and a third socket side corresponding to the third side of the opening; and a semiconductor module disposed in the socket, the semiconductor module including at least one semiconductor device mounted on a module board and configured to make an electrical connection with the motherboard through at least the first socket side, the second socket side, and the third socket side, wherein: a first portion of the socket is disposed above the motherboard and vertically overlaps a portion of the motherboard; no portion of the socket is disposed below the motherboard where the socket vertically overlaps the motherboard; a second portion of the socket is disposed below the module board and vertically overlaps a portion of the module board; and no portion of the socket is disposed above the module board where the socket vertically overlaps the module board; and the at least one semiconductor device is disposed in the opening, wherein: at least part of the at least one semiconductor device is coplanar with at least part of the motherboard.

10. The semiconductor module assembly of claim 9, wherein:
the semiconductor module electrically connects to the motherboard through at least two socket sides of the socket.

11. The semiconductor module assembly of claim 9, wherein:
the socket includes an aligning key that aligns with aligning grooves on the module board.

12. The semiconductor module assembly of claim 11, wherein:
the aligning key includes teeth portions on the first socket side, the second socket side, and the third socket side of the socket.

13. The semiconductor module assembly of claim 9, wherein:
the module board includes a via hole including a conductive material disposed therein and exposed to the outside of the module board;
the socket includes a conductive line including a contact portion exposed at a top surface of a second portion of the socket;
the conductive material contacts the contact portion of the conductive line; and
part of the contact portion is disposed in the via hole.

14. The semiconductor module assembly of claim 9, wherein:
the opening is a rectangular shape including four sides; and
the socket is disposed in the opening along the four sides.

* * * * *